US008896030B2

(12) United States Patent
Mukherjee et al.

(10) Patent No.: US 8,896,030 B2
(45) Date of Patent: Nov. 25, 2014

(54) INTEGRATED CIRCUITS WITH SELECTIVE GATE ELECTRODE RECESS

(75) Inventors: Srijit Mukherjee, Hillsboro, OR (US); Christopher J. Wiegand, Portland, OR (US); Tyler J. Weeks, Hillsboro, OR (US); Mark Y. Liu, West Linn, OR (US); Michael L. Hattendorf, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 29 days.

(21) Appl. No.: 13/606,768

(22) Filed: Sep. 7, 2012

(65) Prior Publication Data

US 2014/0070320 A1    Mar. 13, 2014

(51) Int. Cl.
  *H01L 27/118* (2006.01)
  *H01L 27/088* (2006.01)
  *H01L 29/66* (2006.01)
  *H01L 27/11* (2006.01)

(52) U.S. Cl.
  CPC .......... *H01L 27/0886* (2013.01); *H01L 27/088* (2013.01); *H01L 27/1104* (2013.01); *H01L 29/66477* (2013.01)
  USPC ....................................... 257/204

(58) Field of Classification Search
  CPC ............... H01I 27/0886; H01I 27/088
  USPC ......... 257/368, 330, 303, 369, 377, 382, 384, 257/388, 412, 413
  See application file for complete search history.

(56) References Cited

U.S. PATENT DOCUMENTS

| 5,381,302 | A  | 1/1995  | Sandhu et al. |
| 5,385,866 | A  | 1/1995  | Bartush |
| 6,030,876 | A  | 2/2000  | Koike |
| 6,054,355 | A  | 4/2000  | Inumiya et al. |
| 6,184,129 | B1 | 2/2001  | Hwang et al. |
| 6,207,514 | B1 | 3/2001  | Furukawa et al. |
| 6,235,627 | B1 | 5/2001  | Nakajima |
| 6,294,449 | B1 | 9/2001  | Wu et al. |
| 6,310,367 | B1 | 10/2001 | Yagishita et al. |

(Continued)

FOREIGN PATENT DOCUMENTS

| JP | 2000-031291 | 1/2000 |
| JP | 2001-308323 | 11/2001 |

(Continued)

OTHER PUBLICATIONS

International Search Report and Written Opinion mailed Dec. 17, 2013 for PCT/US2013/056804 filed Aug. 27, 2013.

(Continued)

*Primary Examiner* — Bilkis Jahan
(74) *Attorney, Agent, or Firm* — Blakely, Sokoloff, Taylor & Zafman LLP

(57) ABSTRACT

Integrated circuits including MOSFETs with selectively recessed gate electrodes. Transistors having recessed gate electrodes with reduced capacitive coupling area to adjacent source and drain contact metallization are provided alongside transistors with gate electrodes that are non-recessed and have greater z-height. In embodiments, analog circuits employ transistors with gate electrodes of a given z-height while logic gates employ transistors with recessed gate electrodes of lesser z-height. In embodiments, subsets of substantially planar gate electrodes are selectively etched back to differentiate a height of the gate electrode based on a given transistor's application within a circuit.

16 Claims, 12 Drawing Sheets

(56) References Cited

U.S. PATENT DOCUMENTS

| | | | |
|---|---|---|---|
| 6,512,258 B2 * | 1/2003 | Maeda | 257/303 |
| 6,607,950 B2 | 8/2003 | Henson et al. | |
| 6,774,441 B2 * | 8/2004 | Maki et al. | 257/384 |
| 6,797,556 B2 | 9/2004 | Murthy et al. | |
| 7,397,095 B2 * | 7/2008 | Kim | 257/412 |
| 7,541,239 B2 | 6/2009 | Curello et al. | |
| 7,544,594 B2 | 6/2009 | Change | |
| 7,666,727 B2 | 2/2010 | Doyle et al. | |
| 7,875,519 B2 | 1/2011 | Rachmady et al. | |
| 8,232,607 B2 * | 7/2012 | Edge et al. | 257/382 |
| 2001/0055842 A1 | 12/2001 | Uh et al. | |
| 2002/0160592 A1 | 10/2002 | Sohn | |
| 2002/0192911 A1 | 12/2002 | Parke | |
| 2003/0008496 A1 | 1/2003 | Deleonibus | |
| 2003/0141554 A1 | 7/2003 | Uehara et al. | |
| 2003/0156380 A1 | 8/2003 | Fazan et al. | |
| 2005/0045865 A1 | 3/2005 | Wang | |
| 2005/0167763 A1 | 8/2005 | Kuan et al. | |
| 2005/0221548 A1 | 10/2005 | Doyle et al. | |
| 2006/0073699 A1 | 4/2006 | Lee et al. | |
| 2006/0076579 A1 | 4/2006 | Thean et al. | |
| 2007/0037336 A1 | 2/2007 | Kwon et al. | |
| 2007/0075374 A1 | 4/2007 | Kudou | |
| 2007/0104862 A1 | 5/2007 | Lai | |
| 2007/0122961 A1 | 5/2007 | Zhu et al. | |
| 2007/0241411 A1 | 10/2007 | Yang et al. | |
| 2007/0278593 A1 * | 12/2007 | Watanabe | 257/374 |
| 2008/0166841 A1 | 7/2008 | Hsieh | |
| 2009/0026552 A1 | 1/2009 | Zhang et al. | |
| 2009/0085131 A1 | 4/2009 | Matsubara | |
| 2009/0242936 A1 | 10/2009 | Cheng et al. | |
| 2009/0311859 A1 | 12/2009 | Bonilla et al. | |
| 2011/0298017 A1 | 12/2011 | Jain et al. | |

FOREIGN PATENT DOCUMENTS

| | | |
|---|---|---|
| JP | 2008-130797 | 6/2008 |
| JP | 2008-130979 A | 6/2008 |
| JP | 2010-010218 | 1/2010 |
| JP | 2010-010218 A | 1/2010 |
| KR | 20030052812 | 6/2003 |
| WO | WO-2007/038237 | 4/2007 |
| WO | WO-2011/090571 | 7/2011 |

OTHER PUBLICATIONS

Restriction Requirement for U.S. Appl. No. 12/655,408 dated Sep. 27, 2011, 6 pages.

Office Action for U.S. Appl. No. 12/655,408 dated Nov. 7, 2011, 24 pages.

Final Office Action for U.S. Appl. No. 12/655,408 dated May 23, 2012, 27 pages.

International Search Report and Written Opinion for International Application No. PCT/US2010/059302 dated Sep. 9, 2011, 9 pages.

International Preliminary Report on Patentability for International Application No. PCT/US2010/059302 dated Jul. 4, 2012, 7 pages.

International Search Report and Written Opinion for International Application No. PCT/US2013/056804 dated Dec. 17, 2013, 11 pages.

Hsieh, Y.H., et al., "Process Development of High-k Metal Gate Aluminum CMP at 28nm Technology Node", *Sematech Advanced Metallization Conference* Oct. 5-8, 2010, Albany NY.

Niwa, M., "Development of 32 nm CMOS and recent Trend for Beyond 32 nm", *7th Annual Sematech Symposium*, Jun. 22, 2011 Tokyo Japan.

* cited by examiner

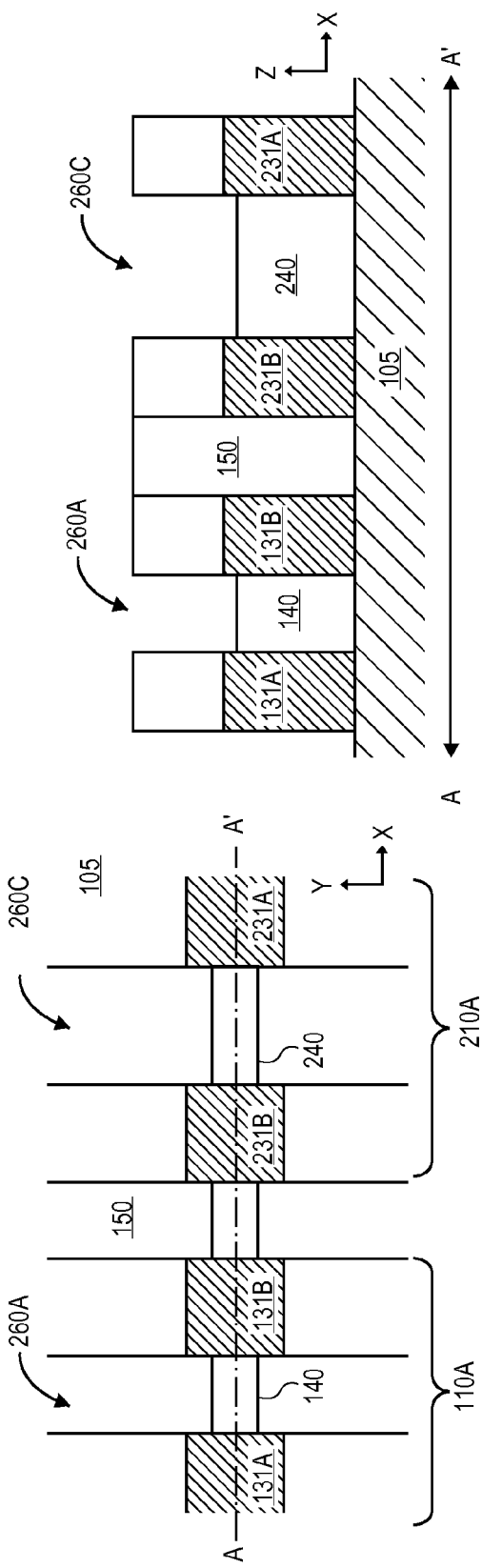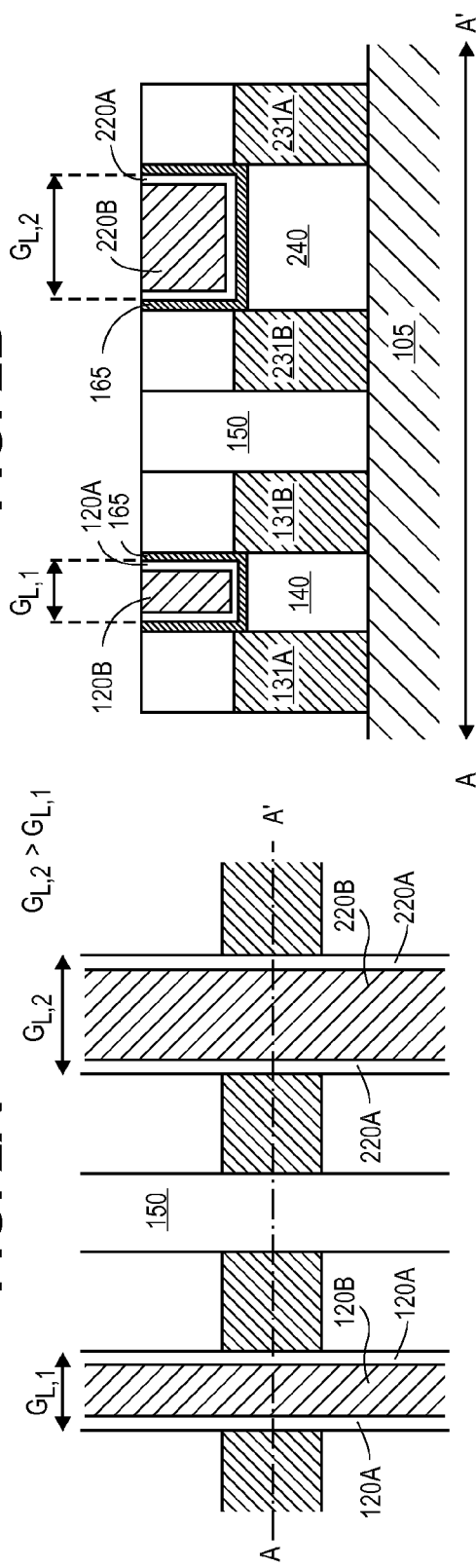

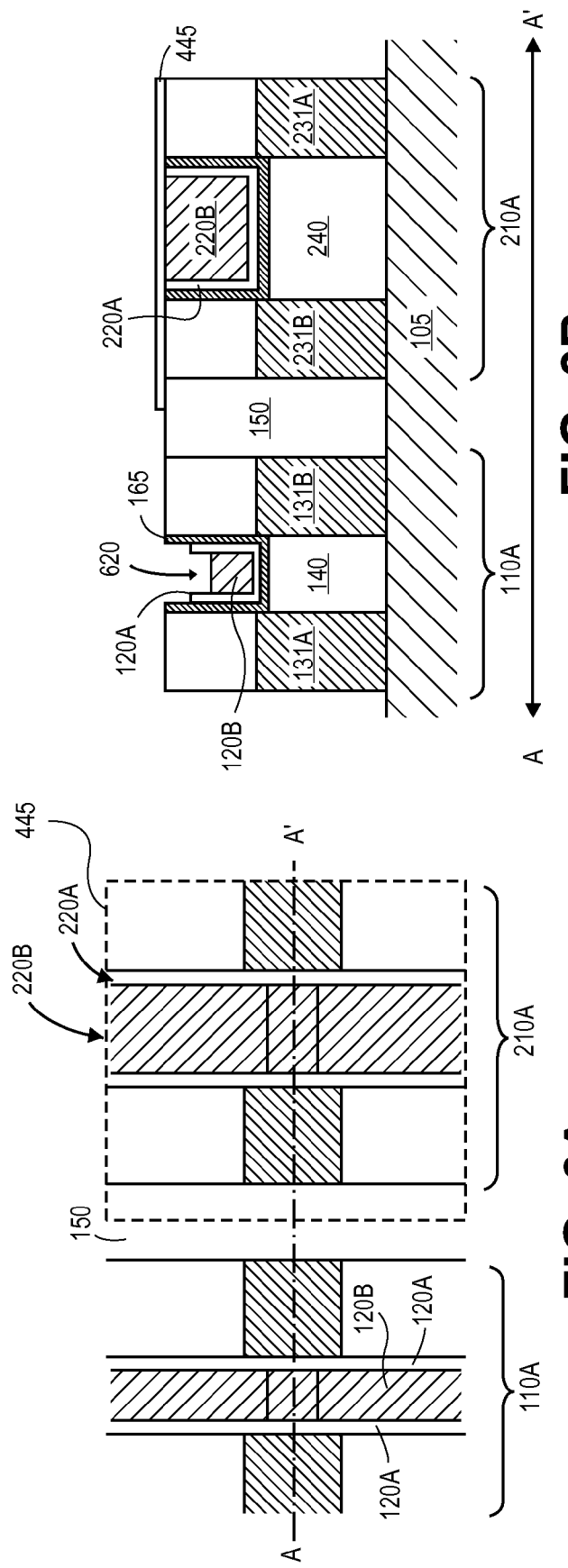

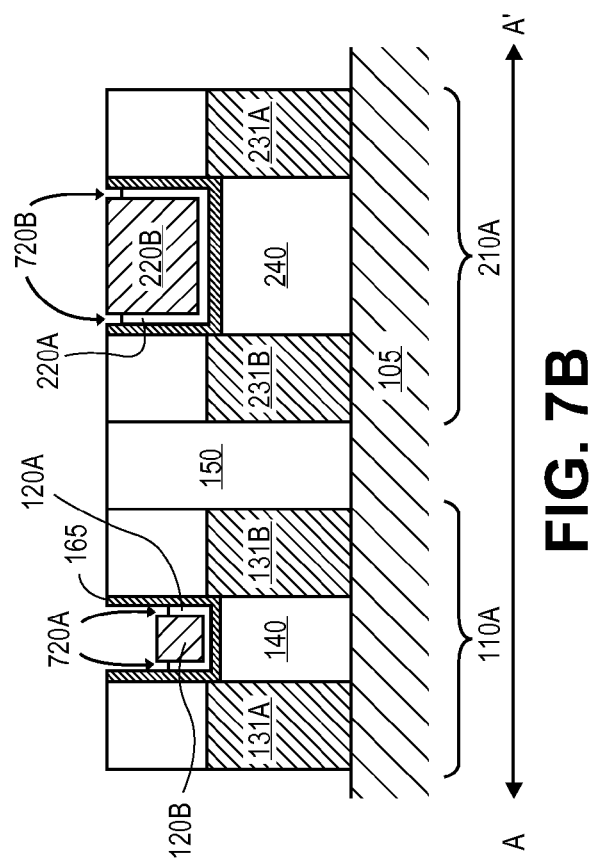
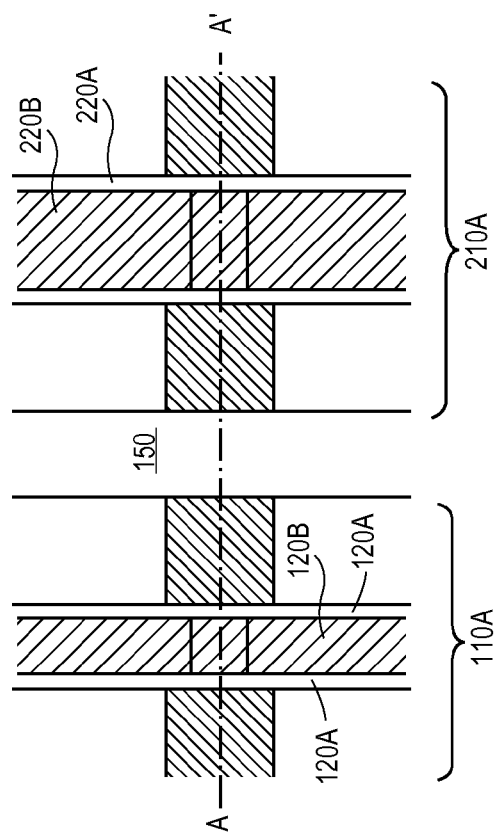
FIG. 7B
FIG. 7A

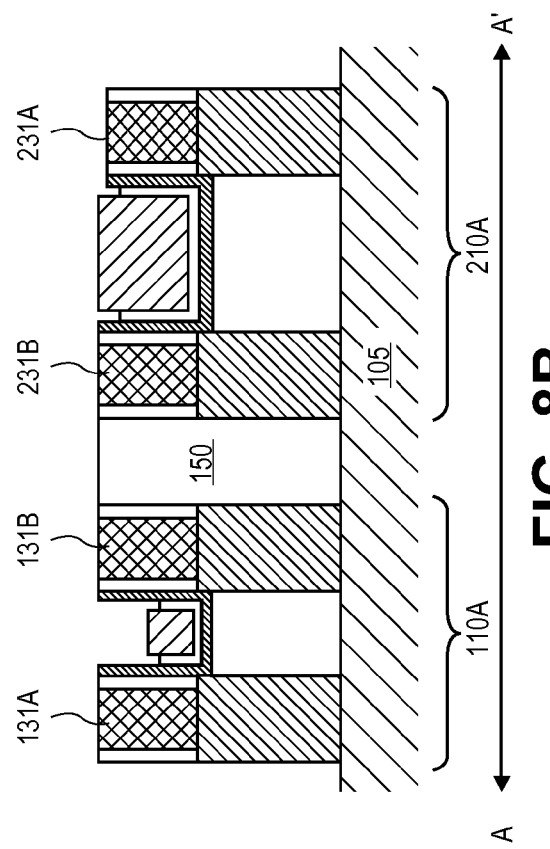
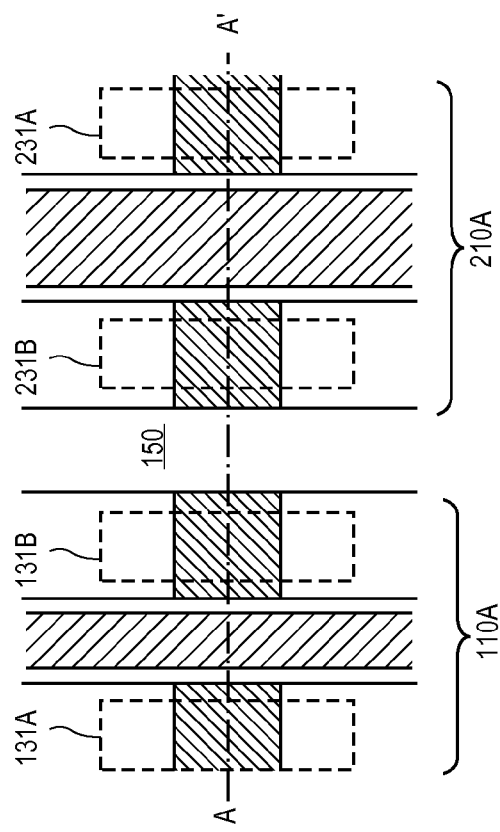
FIG. 8B
FIG. 8A

INTEGRATED CIRCUITS WITH SELECTIVE GATE ELECTRODE RECESS

TECHNICAL FIELD

Embodiments of the invention generally relate to integrated circuits (ICs), and more particularly relate to transistor gate electrode structures where some gate electrodes are recessed relative to other gate electrodes.

BACKGROUND

In modern complementary metal-oxide-semiconductor (CMOS) technology, parasitic transistor gate electrode capacitance is an ever more significant limiter of device performance. With device scaling, reductions in feature pitch continue to reduce distances between electrical nodes of a physical transistor. The introduction of high-k gate dielectrics may also adversely impact parasitic capacitances, for example where fabrication of the high-k gate dielectrics results in high-k films in regions other than at the interface between a transistor channel and the gate electrode. Furthermore, in addition to scaling and new materials introductions, structure geometries are now changing dramatically as the microelectronics industry now transitions from a planar to a non-planar field effect transistor (i.e., Tri-gate or FinFET). Pioneers of non-planar transistor technology are now developing second generation non-planar devices.

Techniques to reduce parasitic gate electrode capacitance are therefore advantageous. Furthermore, because gate electrodes for a given IC chip are typically all of a same z-height, unlike lithographically defined x and y dimensions of the gate electrode, transistor-level z-height control is also advantageous for selective tuning of gate electrode properties.

BRIEF DESCRIPTION OF THE DRAWINGS

Embodiments of the present invention are illustrated by way of example, and not by way of limitation, and can be more fully understood with reference to the following detailed description when considered in connection with the figures in which:

FIGS. 2A, 3A, 4A, 5A, 6A, 7A, and 8A are plan views of MOS transistors as particular fabrication operations are performed to selectively recess gate electrodes, in accordance with an embodiment;

FIGS. 2B, 3B, 4B, 5B, 6B, 7B, and 8B are cross-sectional views corresponding to the plan views in FIGS. 2A, 3A, 4A, 5A, 6A, 7A, and 8A, in accordance with embodiments;

DETAILED DESCRIPTION

Figure 1A:
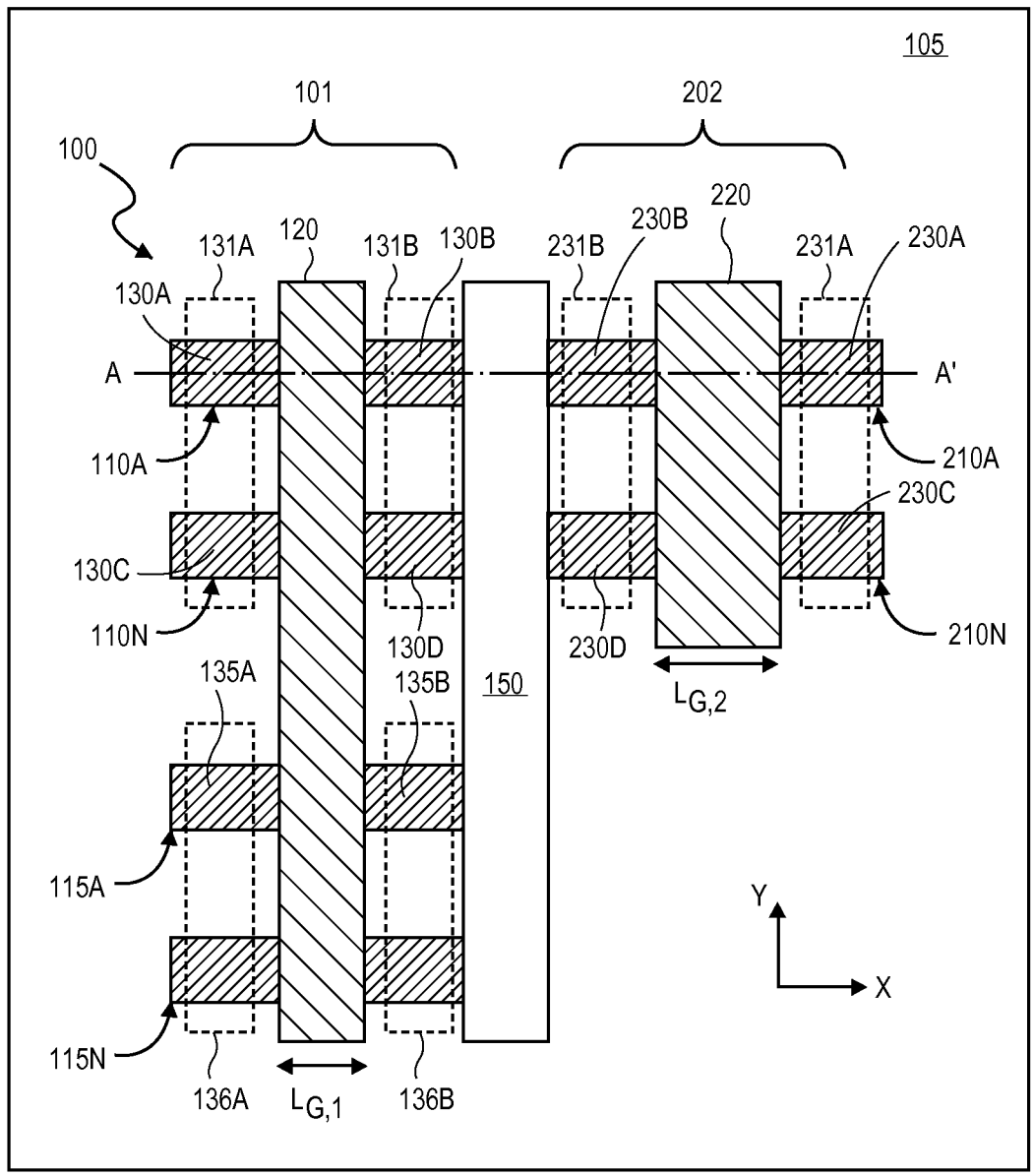
FIG. 1A is a plan view of a layout of transistors in different circuits on a substrate, in accordance with an embodiment of the present invention.

In the following description, numerous details are set forth, however, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "in one embodiment" means that a particular feature, structure, function, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the two embodiments are not specified to be mutually exclusive.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" may be used to indicate that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features.

In embodiments, integrated circuits (ICs) including MOSFETs have selectively recessed transistor gate electrodes. In other words, a transistor with a gate electrode of lesser z-height (i.e., a recessed gate electrode) is monolithically integrated with a transistor having a gate electrode of greater z-height (i.e., non-recessed gate electrodes). As such, in addition to x and y dimensions of a gate electrode being definable at a transistor-level, so too is the gate electrode z-dimension. Transistors with gate electrodes of lesser z-height benefit from reduced parasitic capacitive coupling area, for example, to adjacent source/drain diffusion contact metallization. Parasitic gate capacitance can be most simply modeled as $C = \in A/d$ with A being proportional to z-height of a gate electrode, d being the spacing between the gate electrode and adjacent source/drain contact metallization, and $\in$ being an effective dielectric constant of material disposed between the electrode and contact metallization. As such, a parasitic capacitive area associated with a gate electrode may be modulated through fabrication, along with other structural attributes of the gate electrode, such as gate length ($L_g$) and gate width, based on a given transistor's function within a circuit. Similarly, other gate electrode properties beyond parasitic capacitive area, such as, but not limited to, work function, may be tuned through a modulation of z-height. In embodiments, transistor gate electrode z-heights are differentiated based on individual circuit demands. For example, in circuits where maximum consistency of gate electrode dimension is advantageous for analog transistor matching, or where retention of a greater amount of one or more gate materials enables advantageous tuning of transistor gate electrode work functions, transistors of a greater gate electrode z-height may be employed alongside circuits employing transistors with a recessed gate electrode where minimum parasitic gate capacitance is advantageous.

In one exemplary embodiment, one or more logic gate is recessed from a z-height associated with one or more analog gate. In other words, a greater gate electrode z-height may be provided for an analog gate than a logic gate. In certain such embodiments, all logic gates of a particular IC are recessed from a nominal z-height of all analog gates in the IC. In other embodiments, gate electrode z-height, and the associated parasitic gate electrode capacitance, is differentiated on another basis where only a subset of logic transistors have recessed gate electrodes, or where one or more analog transistors have recessed gates. For example, gate electrode z-height may be modulated between transistors on the basis of conductivity type where NMOS and PMOS transistors have different gate electrode z-heights. In still other embodiments, gate electrode z-height may be varied between two recessed gates. For example, a first transistor in a logic circuit may be recessed relative to reference z-height (e.g., that of an analog gate) by a first amount, such as 25%, while a second transistor in the logic circuit may be recessed by a second amount, such as 45%. While gate electrode z-height differentiation is most thoroughly described herein in the context of logic and analog gates, it will be appreciated that the exemplary structures are equally applicable for differentiating gate electrode z-heights based on any circuit design criteria, or transistor function.

FIG. 1A is a plan view of a layout of certain transistors in a microelectronic device 100, such as an IC, formed on a substrate 105. The microelectronic device 100 includes a circuit 101 and a circuit 202. Generally, the circuit 101 represents a portion of any circuit employing a MOSFET logic gate electrode 120 (i.e., logic circuitry). In the illustrated embodiment, the circuit 101 is an inverter (i.e., NOT gate). In one such embodiment, the circuit 101 is a portion of a static random access memory (SRAM) circuit, for example part of an SRAM cache memory of a microprocessor. The circuit 202 generally represents a portion of any circuit employing MOSFET analog gate electrode 220 (i.e., analog circuitry). For example, the circuit 202 may be a portion of an amplifier circuit, driving a load in response to a control voltage on the gate electrode, as for an I/O circuit of the microelectronic device 100, as part of a thermal sensing circuit, or part of a band gap reference circuit, etc. As illustrated, the MOSFET logic gate electrode 120 has a gate length, $L_{g,1}$ and the MOSFET analog gate electrode 220 has a gate length, $L_{g,2}$. Generally, analog gates are of a greater length than logic gates. In the exemplary embodiment, $L_{g,2}$ is at least 50% larger than $L_{g,1}$. Although the circuits 101, 202 are separated only by an isolation region 150 of minimum dimension, the circuits employing transistor with differentiated gate electrode heights may also be separated by much greater distances, for example where the circuit 101 is located in a core of a microprocessor and the circuit 202 is located in a periphery of the microprocessor core.

As further illustrated in FIG. 1A, the circuit 101 includes a first MOS transistor utilizing a non-planar semiconductor "fin" 110A disposed over a first portion of the substrate 105 while the circuit 202 includes a second MOS transistor utilizing a non-planar semiconductor fin 210A. While the exemplary embodiments utilize non-planar MOSFETs, or "fin-FETS," the skilled artisan may also apply the teachings herein to a planar MOS transistor. In one embodiment illustrated by FIG. 1A, gate electrodes of different heights are employed in the different circuits 101 and 202. For example, a transistor of circuit 101 includes a logic gate electrode 120 disposed over the fin 110A that is "recessed from" or "shorter than" the "non-recessed" analog gate electrode 220 disposed over the fin 210A found in the transistor of circuit 202.

Figure 1B:
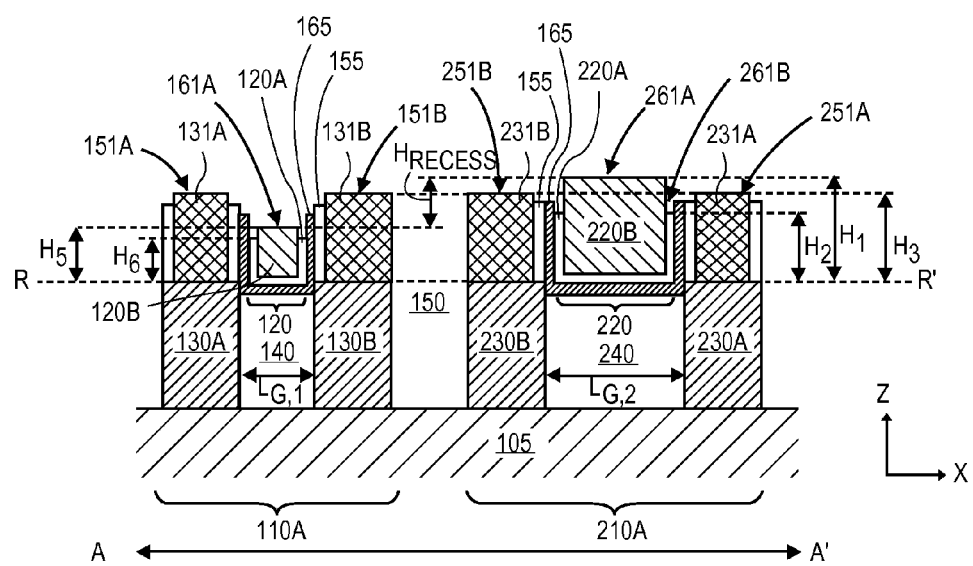
FIG. 1B is a cross-sectional view of two transistors illustrated in FIG. 1A further illustrating one gate electrode recessed relative to another gate electrode, in accordance with an embodiment.

FIG. 1B is a cross-sectional view of the two transistors 110A and 210A along the dashed A-A' line of FIG. 1A and further illustrates a z-height difference between the logic gate electrode 120 and analog gate electrode 220. As shown in FIG. 1B, the logic gate electrode 120 is disposed over a semiconductor channel region 140 of the fin 110A while the analog gate electrode 220 is disposed over a semiconductor channel region 240. Both the gate electrodes 120 and 220 have bottom electrode surfaces proximate to the semiconductor channel regions 140, 240, respectively, with a gate dielectric 165 disposed there between. In the exemplary embodiment, bottom electrode surfaces of the gate electrodes 120 and 220 are at a same reference plane R-R', however bottom gate surfaces may also be different between gate electrodes of different z-height. The analog gate electrode 220 has a top surface portion 261A at a z-height $H_1$ from the bottom gate electrode surface disposed at R-R' while the logic gate electrode 120 has a top surface portion 161A at a gate electrode z-height $H_5$ from the bottom gate electrode surface disposed at R-R'. As shown, at least a portion of the top electrode surface 161A is recessed below at least a portion of the top electrode surface 261A such that the gate electrode z-height $H_5$ is different than the gate electrode z-height $H_1$ by the recess amount $H_{recess}$. Although the gate electrodes 120 and 220 are depicted as having perfectly flat, or level top surfaces, real devices can be expected to have at least some variation in z-height at different points within a given gate electrode. As such, $H_1$, $H_5$, and similar quantities, may be considered averages taken over a same area over a semiconductor channel region and between source-drain contact metallization.

Generally, the recess amount $H_{recess}$ is more than the z-height variation to be found in the gate electrode height $H_1$ such that a recessed gate electrode with z-height $H_5$ is statistically different from a population of gate electrodes characterized by a nominal z-height $H_1$. A population of transistors with recessed gate electrodes characterized as having a z-height $H_5$, along with a population of gate electrodes characterized by a nominal z-height $H_1$, would form a bimodal distribution of gate electrode z-heights. In embodiments where good z-height control is achieved for the analog gate electrode 220 (i.e., deviation about $H_1$ is small), $H_{recess}$ may be as little as 5% of $H_1$. Noting a greater $H_{recess}$ corresponds to greater reduction in parasitic capacitance associated with the logic gate electrode 120, $H_{recess}$ is at least 15% of $H_1$ in more favorable embodiments, at least 25% of $H_1$ in highly advantageous embodiments, and at least 30-50% of $H_1$ (i.e., $H_5$ is 50%-70% $H_1$) in exemplary embodiments. Although a practical upper bound on $H_{recess}$ may vary considerably as a function of implementation and process tolerances, z-height may differ between electrodes by even 80%.

As illustrated in FIGS. 1A and 1B, the semiconductor fin 110A further includes a first source/drain region 130A and a second source/drain region 130B disposed on either side of the logic gate electrode 120 while the semiconductor fin 210A further includes a first source/drain region 230A and a second source/drain region 230B. As further illustrated in FIG. 1A, the exemplary microelectronic device 100 replicates each of the semiconductor fins 110A, 115A, 210A, and 215A as fins 110N, 115N, 210N, and 215N, respectively, having source/drain regions (e.g., 130C, 130D, 230C, 230D) that also couple to source/drain contacts (e.g., 131A, 131B, 231A, 231B). Any number of such fins may share a same gate electrode.

The source/drain regions (e.g., 130A, 130B, 230A, 230B) may be doped regions of the semiconductor fin 110A and may include regrown or epitaxially deposited semiconductor regions such that the z-heights of the source/drain regions exceeds that of the channel regions 140, 240, as depicted. In one exemplary embodiment where the circuit 101 is a CMOS inverter the circuit 101 includes a transistor of a first conductivity type (e.g., N-type) and a transistor of a second, complementary, conductivity type (e.g., P-type). For example, referring to FIG. 1A, where a first transistor employing the semiconductor fin 110A has source/drain regions 130A, 130B of a first conductivity type (e.g., N-type); a second transistor sharing the logic gate electrode 120 employing a semiconductor fin 115A has source/drain regions 135A, 135B of a second conductivity type (e.g., P-type). Each of these source/drain regions are further coupled to source/drain contacts 131A, 131B, 136A, 136B, drawn in dashed line for the sake of clear illustration. Notably, although in the exemplary CMOS inverter embodiment the logic gate electrode 120 has the approximately the same z-height (e.g., $H_5$) over both the semiconductor fins 110A and 115A, the techniques described herein also enable gate electrode z-height differentiation even between two transistors having a same gate electrode. For example, the height of the logic gate electrode 120 may vary from the z-height $H_5$ proximate to the semiconductor fin 110A to the z-height $H_1$ proximate to the semiconductor fin 115A. Furthermore, although not depicted, it should be appreciated that the gate electrode z-height differentiation illustrated in FIG. 1B between a logic transistor and an analog transistor may also be extended to three or more different gate electrode z-heights. As one example, for an SRAM embodiment employing the circuit 101, a pull-down transistor may have a first recessed gate electrode (e.g., recessed 45% relative to an analog gate of the IC) while a pass transistor has a second recessed gate electrode (e.g., recessed 25% relative to an analog gate of the IC).

In embodiments, an entire width of a gate electrode is recessed. For example, referring to FIG. 1A, where the logic gate electrode 120 makes a stripe, the entire stripe is of a same z-height (e.g., $H_5$ from FIG. 1B). In alternate embodiments, where a gate electrode is recessed only along portions of its width, the gate electrode has a reduced z-height along a width of the gate extending adjacent to a source/drain contact. For example, as also illustrated in FIG. 1A, the microelectronic device 100 may include any number of non-planar transistors electrically coupled together in parallel for a greater current carrying channel width and embodiments of the present invention are not limited in this respect. For the exemplary microelectronic device 100, each of the semiconductor fins 110A, 115A, and 210A are replicated as fins 110N, 115N, and 210N, respectively, having source/drain regions that also couple to source/drain contact metallization. In the exemplary embodiment where a single contact metallization 131A spans multiple fins 110A and 110N, the logic gate electrode 120 is recessed along a width adjacent to the contact metallization 131A. The logic gate electrode 120 may then be similarly recessed along the width adjacent to 135A, with a full z-height (e.g., $H_1$) in the intervening span of the logic gate electrode 120, for example where the logic gate electrode 120 may be contacted by an upper level metal.

In embodiments, a gate electrode with a reduced z-height has a top gate electrode surface that is recessed below a top surface of the contact metallization by an amount greater than is the top electrode surface of a gate electrode having a full z-height. For example, as illustrated in FIG. 1B, the logic gate electrode top surface 161A is recessed from the contact metallization top surfaces 151A, 151B while the analog gate electrode top surface 261A is not recessed from the contact metallization top surfaces 251A, 251B, and may actually be proud of the top surfaces 251A, 251B, as depicted. In further embodiments, a gate electrode with a reduced z-height has a top gate electrode surface that is recessed below a top surface of an adjacent spacer dielectric. For example, as also illustrated in FIG. 1B, the logic gate electrode top surface 161A is recessed from a top surface of the dielectric spacer 155 while the analog gate electrode top surface 261A is not recessed from the adjacent dielectric spacer 155.

In embodiments where gate electrodes include a bulk material and a work function material (i.e., a gate electrode stack), at least the bulk material of a recessed gate electrode has a reduced z-height relative to bulk material of a non-recessed gate electrode. In the exemplary embodiment illustrated in FIG. 1B, the gate electrodes 120, 220 have work function materials 120A, 220A respectively disposed between the bulk materials 120B, 220B and the gate dielectric 165. In the depicted embodiment where the gate electrodes are formed by filling a trench, as in a gate replacement process, the work function materials 120A, 220A are disposed along opposite sidewalls of the bulk materials 120B, 220B with both the bulk materials 120B, 220B and the work function materials 120A, 120B present at portions of the first and second top electrode surfaces 161A, 261A, respectively. Generally, the work function materials 120A, 120B may be any known in the art. Notably, the work function material 120A may also be different than the work function material 220A, for example where different work functions are desired for transistors of different conductivity type. Similarly, the bulk materials 120B, 220B may be any known in the art, such as, but not limited to polysilicon or one or metals (e.g., tungsten (W), copper (Cu), aluminum (Al), their alloys, etc.). For alternative embodiments where a gate electrode is a homogenous material, the entire gate electrode is represented by the bulk material illustrated in the more complex gate electrode stack.

As illustrated in FIG. 1B, both the bulk material 120B and the work function material 120A in the logic gate electrode 120 are recessed, to z-heights $H_5$ and $H_6$, respectively. Depending on the embodiment, $H_5$ and $H_6$ may be approximately equal, $H_6$ may be significantly less than $H_5$, as depicted, or $H_6$ may be significantly larger than $H_5$, (e.g., where work function material stringers are left as fabrication artifacts along the adjacent gate dielectric 165 and/or spacer dielectric 155 separating the logic gate electrode 120 from the adjacent source/drain contacts 131A, 131B). In advantageous embodiments, both $H_5$ and $H_6$ are recessed by $H_{recess}$ that is at least 5%, and more advantageously at least 25% and most advantageously at least 30-50% the z-height $H_1$. Reducing z-height of both bulk and work function materials may have a greater impact on parasitic capacitance, although depending on the conductivity of the work function material 120A, recessing of the bulk material 120B alone may provide a notable reduction in parasitic gate capacitance, or favorable tuning of work function. Conversely, having the analog gate 220 at a z-height of $H_1$ may advantageously provide a desired amount of one or more work function material 220A and/or bulk material 220B desired for analog circuit performance (e.g., to achieve a particular work function for the analog gate 220 or achieve a level of matching between two analog gates). While the illustrative embodiment depicts gate electrode structure indicative of a gate replacement fabrication technique, embodiments of the present invention are also applicable to "gate first" fabrication techniques where a gate electrode top surface typically entails only the bulk material with the work function material and/or the gate dielectric 165 absent from the sidewalls of the bulk gate material. Thus, in both replacement-gate and gate-first embodiments, at least the bulk material of a recessed gate electrode has a reduced z-height.

Depending on the technique employed to selectively differentiate gate electrode z-heights between transistors, the amount of recess between two gate electrodes may further differ between bulk materials and work function materials as a function of a difference in z-height between the bulk material and the work function metal present in a gate electrode having the greater z-height. For example, as illustrated for the analog gate 220 in FIG. 1B, the work function material forms a sidewall having a top surface 261B at z-height $H_2$ from the bottom gate electrode surface on the R-R' plane. In the exemplary embodiment where $H_2$ is less than $H_1$ associated with the bulk material, the work function metal of the analog gate 220 is itself recessed relative to the bulk material such that the top surface portion 161A of the logic gate electrode 120 is recessed from the bulk material top surface 261A more than it is from the work function material top surface 261B.

Figure 9A:
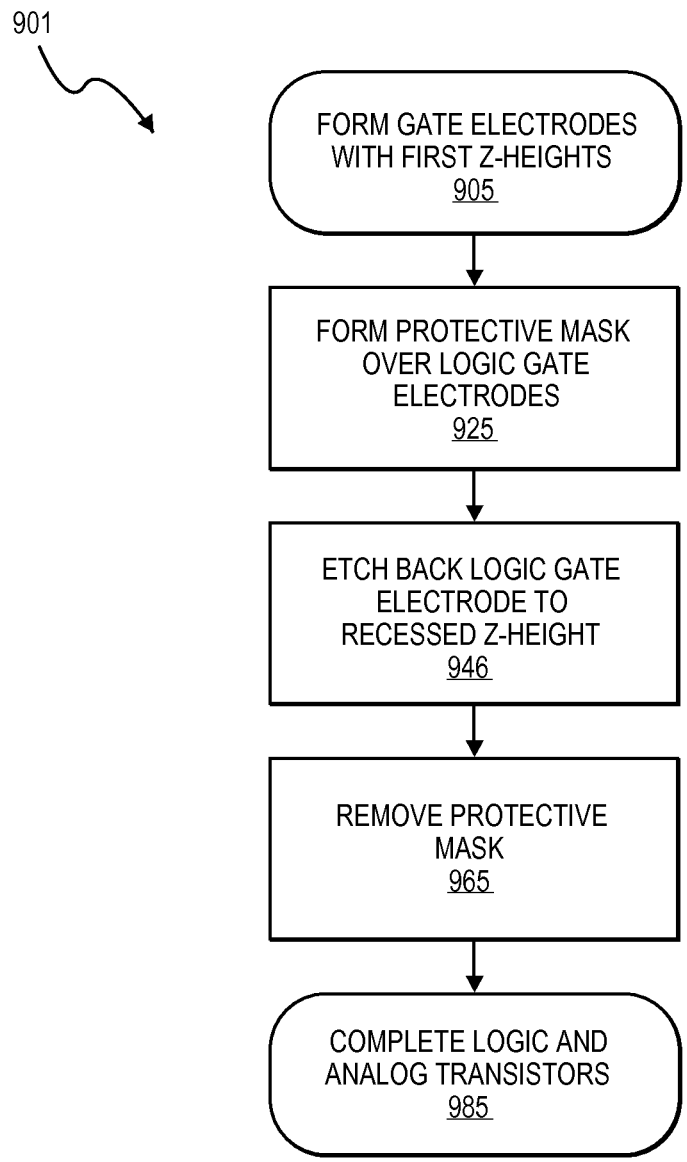
FIGS. 9A and 9B are flow diagrams illustrating methods of selectively recessing gate electrodes, in accordance with embodiments.

With structural features associated with embodiments of the present invention described, techniques for selectively recessing gate electrode in accordance with embodiments of the present invention are now described. FIGS. 2A, 3A, 4A, 5A, 6A, 7A, and 8A are plan views of transistors as particular fabrication operations are performed to selectively recess gate electrodes, in accordance with an embodiment. Such techniques may be utilized to arrive at the structures of FIGS. 1A, 1B. FIGS. 2B, 3B, 4B, 5B, 6B, 7B, and 8B are cross-sectional views corresponding to the plan views in FIGS. 2A, 3A, 4A, 5A, 6A, 7A, and 8A, in accordance with embodiments. FIG. 9A is a flow diagram illustrating methods 901, 902 for recessing logic gate electrodes selectively to analog gate electrodes, in accordance with embodiments. It is noted that while the exemplary methods are described in furtherance of the exemplary embodiment where gate electrode z-height is differentiated between logic and analog gates, it will be appreciated that the exemplary methods are equally applicable to differentiating gate electrode z-heights for any subset of gate electrodes based on any circuit design criteria, or transistor function.

Referring first to FIG. 9A, the method 901 generally entails forming first and second gate electrodes (e.g., a logic and an analog gate) at given z-heights and then selectively etching back the first (logic) gate electrode relative to the second (analog) gate electrode to arrive at electrodes with differing z-heights. The exemplary method 901 begins at operation 905 with forming logic and analog gate electrodes having bottom electrode surfaces proximate to a gate dielectric disposed over semiconductor channel regions and having a top electrode surface at a nominal height from the bottom gate electrode surface. While operation 905 may be performed with any techniques known in the art and embodiments of the present invention are not limited in this respect, in the exemplary embodiment illustrated in FIGS. 2A and 2B, operation 905 entails first processing the substrate 105 to form trenches 260A and 260C exposing semiconductor channel regions 140 and 240. As further illustrated in FIGS. 3A and 3B, operation 905 then entails filling the trenches 260A and 260C with the gate dielectric 165, the work function materials 120A, 220A and the bulk materials 120B, 220B and polishing back any overburden to arrive at substantially planarized logic and analog gate electrode top surfaces of a substantially same z-height for both a logic gate and an analog gate.

The method 901 then proceeds to operation 925 where a protective mask is formed over an analog gate electrode as a basis for selectively recessing at least a portion of an unmasked (logic) gate electrode to a level below at least a portion of the protected top electrode surface. Formation of the protective mask may be non-trivial in view of the materials employed for the gate electrodes and their reactivity with mask materials and/or the susceptibility of the mask material to processes employed to recess one or more portions of the first gate electrode. For example, where a bulk material of the gate electrodes is tungsten, a tungsten etch process may have insufficient selectivity to a photosensitive mask (e.g., photo resist) or a subsequent photo resist strip (e.g., ash) may be detrimental to one or more materials present after recessing a gate electrode. As such, method 902 (FIG. 9B) illustrates advantageous embodiments where forming the protective mask further entails forming a multi-layered mask. In embodiments, the multi-layered mask comprises a plurality of layers, at least one of which is a non-photosensitive hard mask. In particularly advantageous embodiments where a gate electrode includes at least a metal bulk material, such as tungsten, the multi-layered mask includes a metal mask layer, formed in direct contact with the logic and analog gate electrodes at operation 930. In exemplary embodiments, the metal mask layer is a metal present in the gate electrode, for example in the bulk material or in a work function material.

Figure 4B:
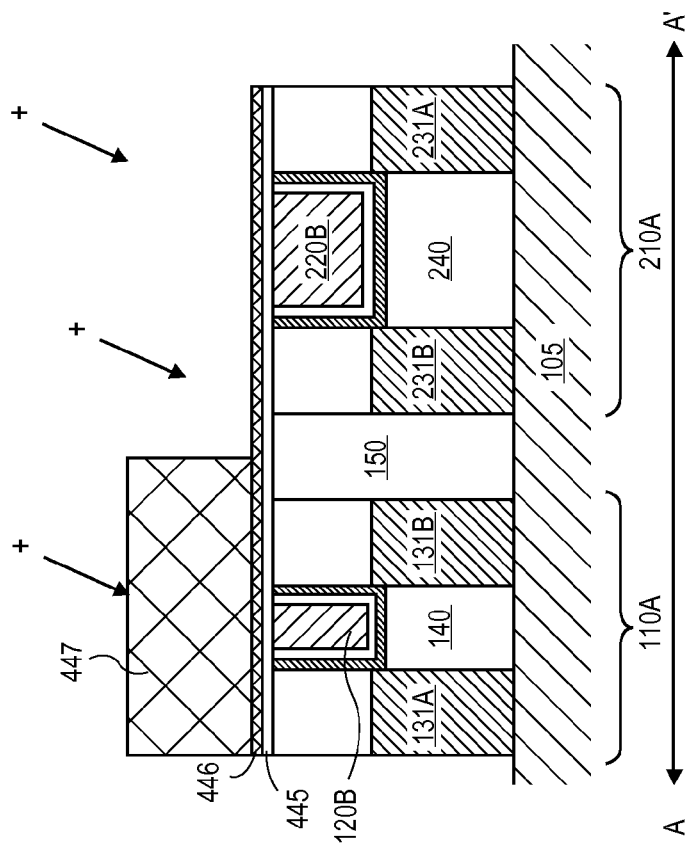
Figure 4A:
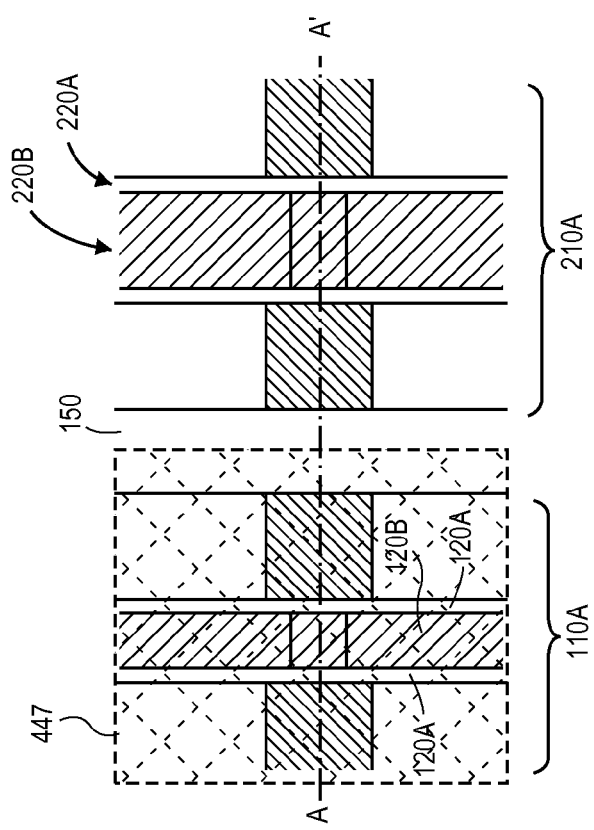
Figures 5A, 5B:
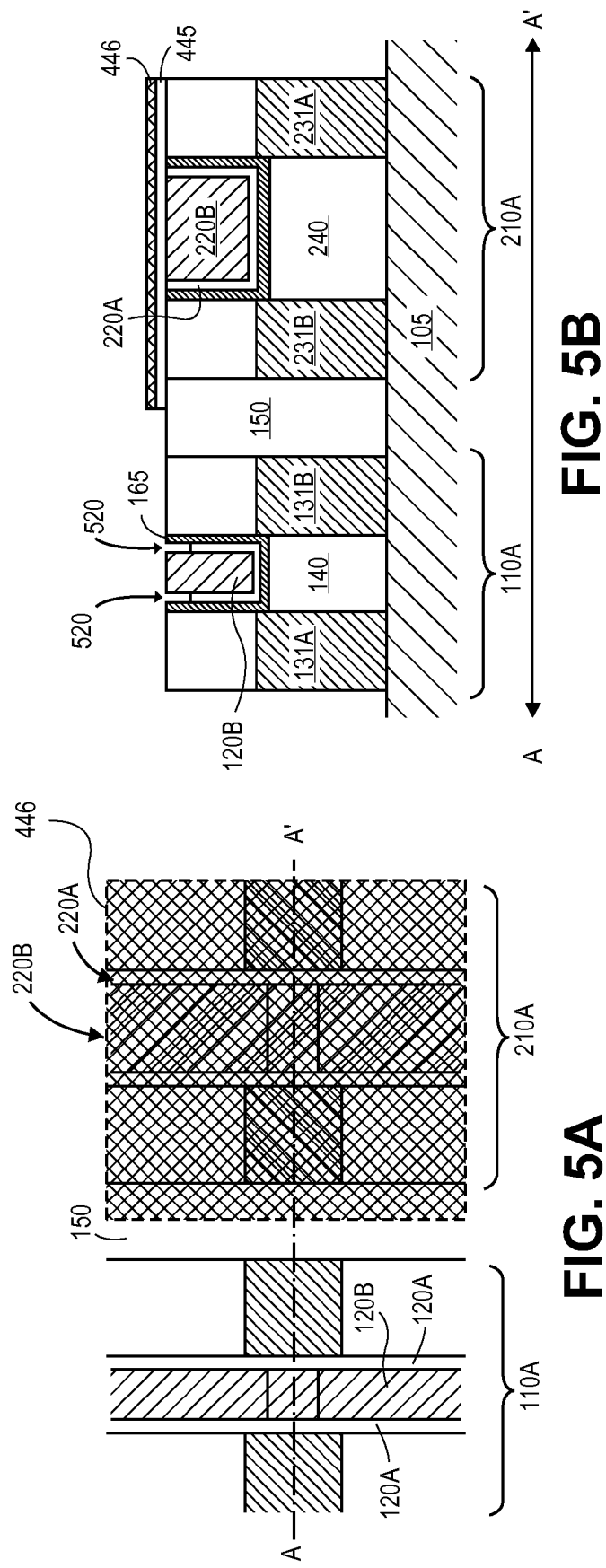

FIGS. 4A and 4B further illustrate a metal mask layer 445 deposited over the substrate 105, in contact with top surfaces of the gate electrode bulk materials 120B, 220B, as well as the work function materials 120A, 220A. For the exemplary metal gate embodiments where the gate electrode bulk materials 120B, 220B and work function materials 120A, 220A are all metals, the metal mask 445 includes a metal which may be etched selectively to at least the metal(s) employed in the bulk materials 120B, 220B. In one exemplary embodiment where the bulk materials 120B, 220B are tungsten, the metal mask 445 comprises titanium (Ti) or a non-tungsten alloy thereof having good etching properties (e.g., TiN, TiAl, etc.). In advantageous embodiments, the metal mask 445 is a binary non-tungsten Ti alloy, which has only trace levels of impurities that are immaterial to the functions of the metal mask 445 described herein. As described further herein, depending on the embodiment, the metal mask 445 may have a range of thicknesses between 20 nm and 300 nm, for example.

Returning to FIG. 9B, with the metal mask layer in place, formation of the protective mask proceeds with operation 935 wherein a secondary mask is formed over a portion the metal mask layer that is disposed over only the analog gate electrode (i.e., the electrode that is to remain at a full z-height as formed at operation 905 (FIG. 9A). As illustrated by the dashed lines in FIG. 9B, the method 902 depends on whether the secondary mask formed at operation 935 is a photosensitive or non-photosensitive mask.

In one embodiment, where a photosensitive secondary mask (i.e., photo resist) is formed on the metal mask layer at operation 935, the method 902 proceeds to operation 940 where a partial thickness of the metal mask layer disposed over the logic gate electrode unprotected by the photo resist mask is etched. Any etch process known in the art to be suitable for the particular composition of the metal mask layer may be utilized at operation 940 with a goal being to controllably thin, but not clear, the metal mask layer in the regions which are to have recessed gate electrodes. For example, a timed etch performed operation 940 may provide a differential hard mask thickness over logic and analog gates which is to be subsequently utilized to expose the logic gate electrode. The method 902 then proceeds to operation 942 where the photo resist mask is removed by any conventional technique (e.g., plasma ash, wet strip, etc.). At operation 945 a blanket etch of the metal mask layer is then performed to clear the thinner portions of the metal mask layer (e.g., disposed over a logic gate) while only a partial thickness of the thicker regions of the metal mask layer is removed by the etch. For such embodiments, the metal mask layer is in the upper end of the range described elsewhere herein (e.g., 200 nm-300 nm) with the etch process being any wet or dry etch known to be suitable for the given composition of the metal mask layer (e.g., Ti alloy, etc.). With the metal mask layer now patterned as the protective mask, the method 902 returns to operation 946 in method 901 (FIG. 9A).

Figure 9B:
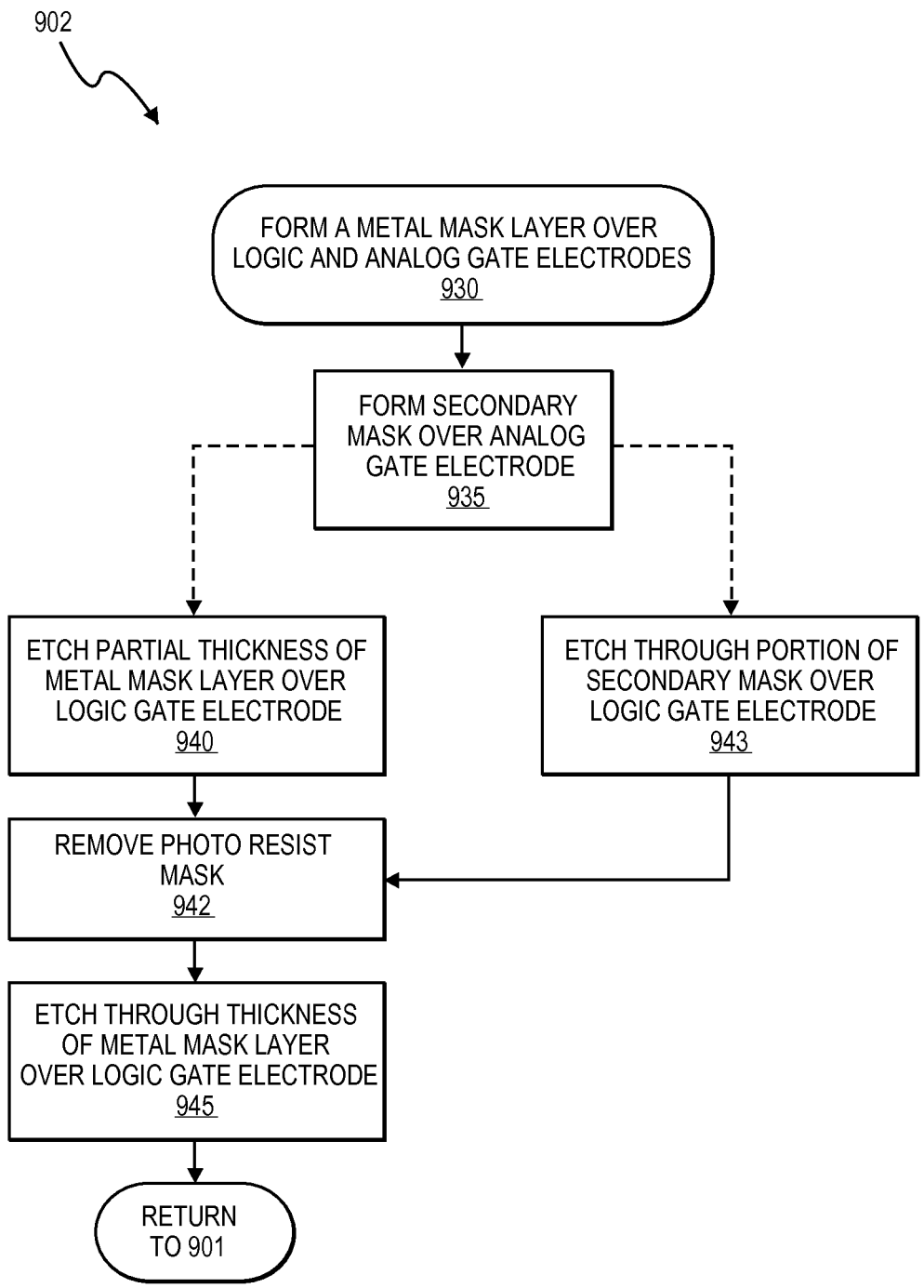

Continuing with description of FIG. 9B, where the secondary mask is non-photosensitive and one or more hard mask layer is deposited on the metal mask layer at operation 935, the method 902 proceeds to operation 943 where the portion of the hard mask disposed over the logic gate electrode is etched through to expose the metal mask layer. FIGS. 4A, 4B further illustrate one such embodiment where a hard mask layer 446 is deposited over the metal mask layer 445. The composition of the hard mask layer 446 is dependent on the composition of the metal mask layer 445 at least to the extent that a selective etch of the hard mask layer 446 is advantageous as is an etch process that can be performed over a logic gate selectively to an analog gate. While silicon dioxide and silicon nitride hard mask materials may be used in certain embodiments, in an exemplary embodiment where the metal mask layer 445 is a Ti alloy, the hard mask layer 445 is predominantly silicon. A silicon hard mask layer 445 can, under certain circumstances, be advantageously etched with good selectivity to TiN, and other Ti alloys. Over one portion of the hard mask layer, a photo resist pattern is then formed. In the exemplary embodiment further illustrated in FIG. 4B, a photo resist mask 447 is formed over a portion of the hard mask layer 445 disposed over the logic gate electrode (i.e., the gate that is to be recessed).

In embodiments, the material composition of one of the first and second portions the secondary mask is modified to enhance selectivity of an etchant employed in the etching of the secondary mask. Generally, modifying material composition of a hard mask layer forming the secondary mask may entail one or more of: oxidation, nitridation, or doping with a species, that either enhances or retards the etch rate of the modified portion of the material. FIGS. 4A and 4B further illustrate an exemplary embodiment where a dopant species is implanted into a portion of the hard mask 446 not protected by the photo resist mask 447. In the context of a silicon hard mask layer 446, doping of the silicon can serve as a basis of etch selectivity between doped and undoped regions for certain wet etch chemistries known in the art. For example, where the species is p-type (e.g., boron), the wet etch rate can be reduced relative to an undoped region. With the hard mask layer 446 composition selectively modified based on the photo resist pattern, the method 902 then proceeds to operation 942 where the photo resist mask is removed by any conventional technique (e.g., plasma ash, wet strip, etc.) such that photo resist selectivity of the process subsequently employed to etch the hard mask is inconsequential. The hard mask layer 446 is then blanket etched for a time sufficient to clear either the modified portion without clearing the unmodified portion (as for a silicon hard mask modified into p-type for the embodiment depicted in FIG. 5A, 5B), or vice versa. At operation 945 the metal mask layer unprotected (e.g., region over a logic gate) by the hard mask is etched to clear. For such embodiments, the metal mask layer may be advantageously relative thin (e.g., 20 nm-30 nm) and any wet or plasma-based metal etch process may be utilized depending on the metal mask composition. With the metal mask layer now patterned as the protective mask, the method 902 returns to operation 946 in method 901 (FIG. 9A).

In another embodiment of method 902 (FIG. 9B) where operation 935 entails depositing a hard mask, a multi-layered hard mask is deposited over the metal mask layer, for example to form a tri-layer mask. In a tri-layer mask embodiment, the hard mask layers deposited over the metal mask layer may be of any material and thickness that offer sufficient etch selectivity between each other if the layer in contact with the metal mask layer also offers sufficient etch selectivity relative to the metal mask layer. In one exemplary embodiment where a first hard mask layer in contact with the metal mask layer is silicon, the second hard mask layer is silicon dioxide ($SiO_2$), although other combinations may also be utilized. Following deposition of the multi-layered hard mask, a photo resist is patterned, and at least the first layer of the multi-layered hard mask is etched (e.g., silicon dioxide layer) using any technique conventional to the material. The method 902 then proceeds to operation 942 where the photo resist mask is removed by any conventional technique (e.g., plasma ash, wet strip, etc.) such that photo resist selectivity of the process employed to further etch the hard mask is inconsequential. After the second layer of the multi-layered hard mask is etched, the metal mask layer unprotected by the hard mask (e.g., region over a logic gate) is etched to clear at operation 945. For such embodiments, the metal mask layer may be advantageously relative thin (e.g., 20 nm-30 nm) and any wet or plasma-based metal etch process may be utilized depending on the metal mask composition. With the metal mask layer now patterned as the protective mask, the method 902 returns to operation 946 in method 901 (FIG. 9A).

As illustrated in FIG. 9A, at operation 946 the logic gate is etched back. As further illustrated in FIGS. 6A, 6B, gate electrode recesses 620 are first formed by etching the work function material 120A. In advantageous embodiments wherein the metal mask layer 445 includes a metal present in work function material, etching of the metal mask layer 445 may also serve to form the recesses 620. In other embodiments, the recesses 620 are formed with a second etch process, distinct from that used to pattern the metal mask layer 445. As further illustrated in FIG. 6A, 6B, the etchback of gate electrode further entails recessing the bulk material 120B. In advantageous embodiments, recessing of the bulk material 120B, for example with a plasma etch process where the bulk material 120B is tungsten, also etches through the hard mask layer 446 without etching through the metal mask layer 445, thereby maintaining protection of the bulk material 220B from the bulk recess etch while preparing for subsequent removal of the remain metal mask layer 445, if desired.

In embodiments, recessing of a gate electrode further comprises a second recessing of the work function material after recessing the bulk material. As illustrated in FIG. 7B recesses 720A are formed by a second etch of the work function material 120A that may, for example, occur during the removal of the metal mask 445 (e.g., at operation 965 in FIG. 9A), just as the first recessing of the work function material may occur during patterning of the metal mask 445. In further embodiments, as also illustrated in FIGS. 6B, 7B, removal of the metal mask 445 also recesses the work function material 220A relative to the bulk material 220B and/or the gate dielectric, forming recesses 720B. With the metal mask layer 445 being of a same or similar material as the work function material 120A, compatibility with the bulk material 120B with respect to etch chemistry and reactivity is advantageously ensured, and the gate recess etch process is efficient with little overhead associated with hard mask removal.

With the gate electrode z-heights now differentiated, the method 901 may proceed to operation 985 with completion of the logic and analog finFETs. For example, with formation of the source-drain contact metallization 131A, 231A, as illustrated in FIGS. 8A, 8B. Any conventional interconnect process may then be utilized to complete fabrication of an IC with selectively recessed gate electrodes. Alternatively, before interconnect processing is commenced, a blanket electrode recessing may be performed to non-selectively reduce the z-height of all gate electrodes below that provided at operation 905 while retaining a z-height difference between gate electrodes (e.g., a logic gate may be recessed by 45% relative to an initial height while an analog gate, or other logic gate is recessed by 25%). In still other embodiments, one or more additional iterations of method 901 are performed to achieve more than the two z-heights illustrated in the exemplary embodiment. For example, selective thinning of the metal hard mask with a separate mask may be combined with one of the exemplary hard mask technique to selectively thin portions of the metal mask remaining after gates in a first region are recessed. Second regions where the metal mask are thinned would then be exposed before third regions allowing for gate electrodes in the second regions to be recessed a second, lesser, amount while the gates in the first region are recessed again to a greater amount.

Figure 10:
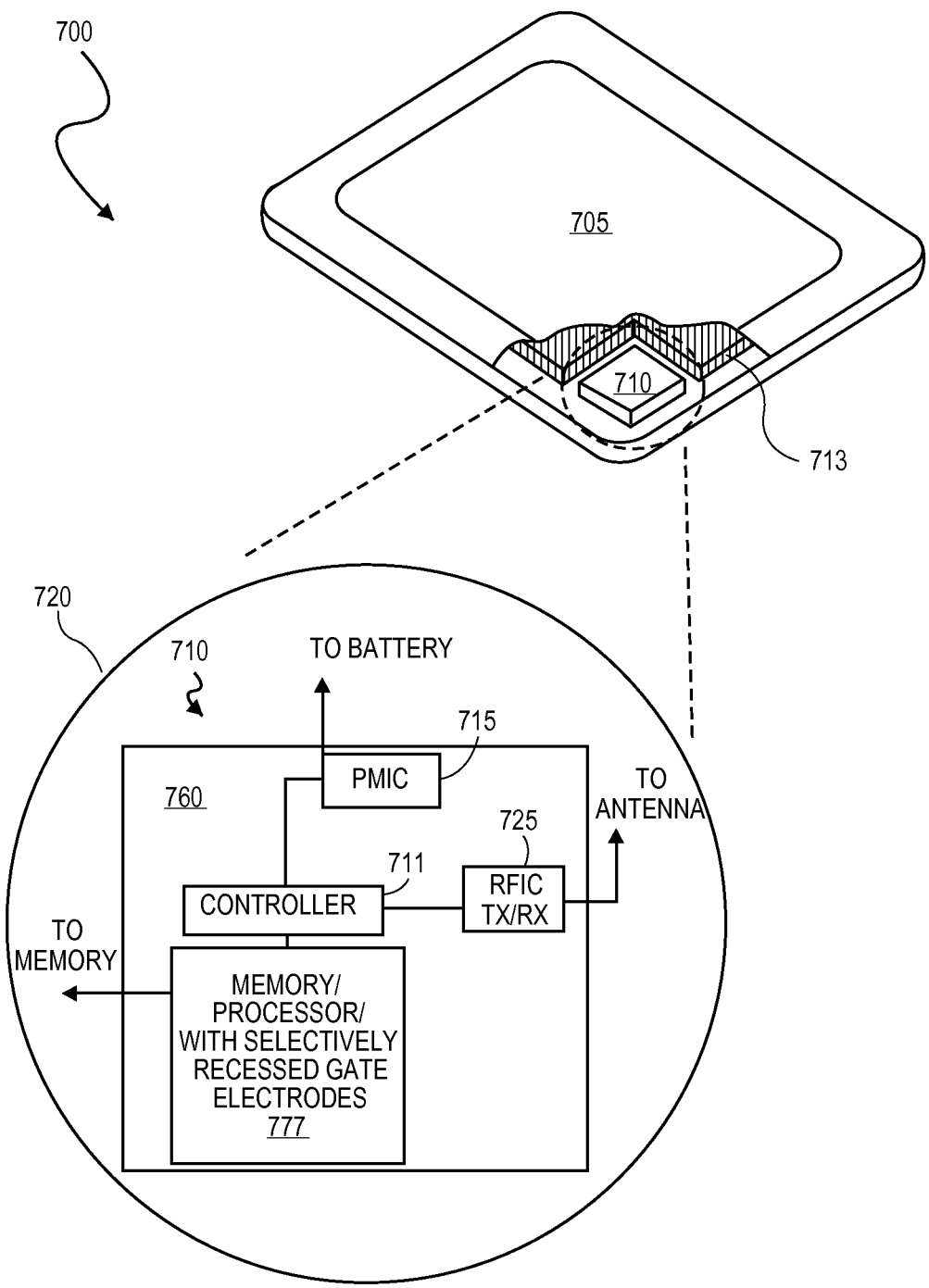
FIG. 10 is an isometric view of a mobile computing platform employing an IC with transistors of recessed and non-recessed gate electrode z-heights, in accordance with an embodiment of the present invention.

FIG. 10 is an isometric view and schematic of a mobile computing platform 700 which employs an IC including extended drain non-planar MOSFET ESD circuitry, in accordance with embodiments of the present invention. The mobile computing platform 700 may be any portable device configured for each of electronic data display, electronic data processing, and wireless electronic data transmission. For example, mobile computing platform 700 may be any of a tablet, a smart phone, laptop computer, etc. and includes a display screen 705 which in the exemplary embodiment is a touchscreen (capacitive, inductive, resistive, etc.), a chip-level (SoC) or package-level integrated system 710, and a battery 713.

The integrated system 710 is further illustrated in the expanded view 720. In the exemplary embodiment, packaged device 777 includes at least one memory chip (e.g., RAM), and/or at least one processor chip (e.g., a multi-core microprocessor and/or graphics processor) employing transistors with gate electrodes of differing z-height. In one particular embodiment, the package device 777 is a microprocessor with a logic gate of a lesser z-height than an analog gate. The packaged device 777 is further coupled to the board, substrate, or interposer 760 along with, one or more of a power management integrated circuit (PMIC) 715, RF (wireless) integrated circuit (RFIC) 725 including a wideband RF (wireless) transmitter and/or receiver (e.g., including a digital baseband and an analog front end module further comprises a power amplifier on a transmit path and a low noise amplifier on a receive path), and a controller thereof 711.

Functionally, the PMIC 715 performs battery power regulation, DC-to-DC conversion, etc., and so has an input coupled to the battery 713 and with an output providing a current supply to all the other functional modules. As further illustrated, in the exemplary embodiment the RFIC 725 has an output coupled to an antenna to provide to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs coupled to the package substrate of the packaged device 777 or within a single IC (SoC) coupled to the package substrate of the packaged device 777.

Figure 11:
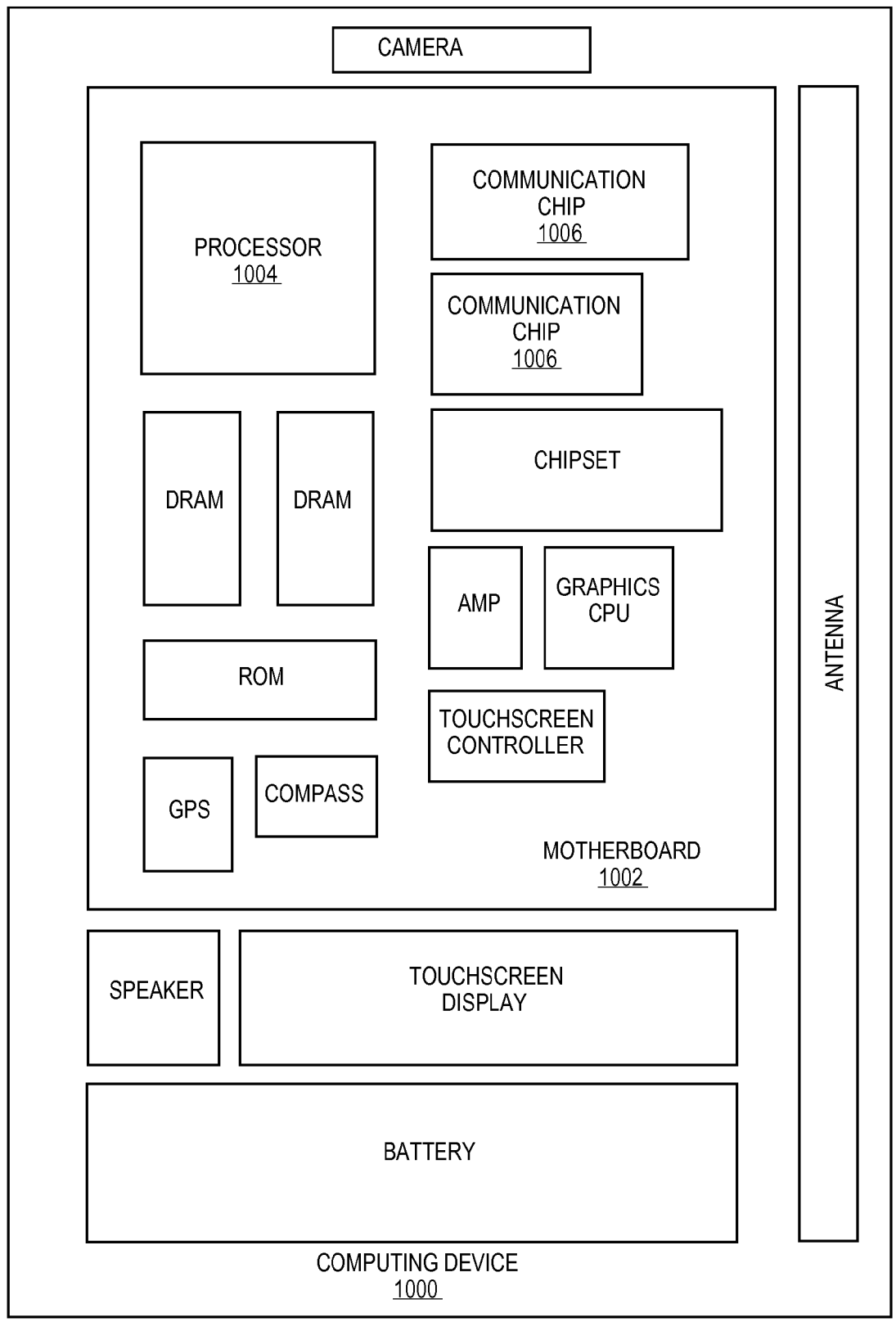
FIG. 11 is a functional block diagram of the mobile device illustrated in FIG. 10, in accordance with an embodiment of the present invention.

FIG. 11 is a functional block diagram of a computing device 1000 in accordance with one embodiment of the invention. The computing device 1000 may be found inside the platform 700, for example, and further includes a board 1002 hosting a number of components, such as but not limited to a processor 1004 (e.g., an applications processor) and at least one communication chip 1006. In embodiments, at least one of the processor 1004 and communication chip 1006 incorporate transistors with selectively recessed gate electrodes, as have been described in the context of certain exemplary embodiments elsewhere herein. The processor 1004 is physically and electrically coupled to the board 1002. The processor 1004 includes an integrated circuit die packaged within the processor 1004. The term "processor" may refer to any device or portion of a device that processes electronic data from registers and/or memory to transform that electronic data into other electronic data that may be stored in registers and/or memory.

In some implementations at least one communication chip 1006 is also physically and electrically coupled to the board 1002. In further implementations, the communication chip 1006 is part of the processor 1004. Depending on its applications, computing device 1000 may include other components that may or may not be physically and electrically coupled to the board 1002. These other components include, but are not limited to, volatile memory (e.g., DRAM), non-volatile memory (e.g., ROM), flash memory, a graphics processor, a digital signal processor, a crypto processor, a chipset, an antenna, touchscreen display, touchscreen controller, battery, audio codec, video codec, power amplifier, global positioning system (GPS) device, compass, accelerometer, gyroscope, speaker, camera, and mass storage device (such as hard disk drive, solid state drive (SSD), compact disk (CD), digital versatile disk (DVD), and so forth).

At least one of the communication chips 1006 enables wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to those described elsewhere herein. The computing device 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

It will be recognized that the invention is not limited to the embodiments so described, but can be practiced with modification and alteration without departing from the scope of the appended claims. The scope of the invention should, therefore, be determined with reference to the appended claims, along with the full scope of equivalents to which such claims are entitled.

We claim:

1. An integrated circuit device, comprising:
   a first nMOS transistor disposed over a first portion of a substrate, wherein the first MOS transistor comprises:
      a first semiconductor channel region; and
      a first gate electrode having a first bottom electrode surface proximate to a first gate dielectric disposed over the first semiconductor channel region and having a first top electrode surface at a first height from the first bottom gate electrode surface, the first gate dielectric having a first top gate dielectric surface at a third height from the first bottom gate electrode surface; and
   a second MOS transistor disposed over a second portion of the substrate, wherein the second MOS transistor comprises:
      a second semiconductor channel region; and
      a second gate electrode having a second bottom electrode surface proximate to a second gate dielectric disposed over the second semiconductor channel region and having at least a portion of a second top electrode surface at a second height from the second bottom electrode surface that is different than the first height, the second gate dielectric having a second top gate dielectric surface at a fourth height from the second bottom gate electrode surface that is different than the third height.

2. The device of claim 1, wherein the second height is larger than the first height, and wherein the second gate electrode defines a gate length of the second MOS transistor that is larger than that of the first MOS transistor.

3. The device of claim 1, further comprising:
   a first semiconductor source and drain on opposite sides of the first semiconductor channel region;
   a first spacer dielectric disposed between the first gate electrode and the first semiconductor source and drain;
   a second semiconductor source and drain on opposite sides of the second semiconductor channel region;
   a second spacer dielectric disposed between the second gate electrode and the second semiconductor source and drain, wherein the first top electrode surface is recessed below a top surface portion of the first spacer dielectric by an amount greater than is the second top electrode surface relative to the second spacer dielectric.

4. The device of claim 1, wherein at least a portion of the second top electrode surface is recessed by at least 30% of the first height.

5. An integrated circuit device, comprising:
   a first MOS transistor disposed over a first portion of a substrate wherein the first MOS transistor comprises:
      a first semiconductor channel region; and
      a first gate electrode having a first bottom electrode surface proximate to a first gate dielectric disposed over the first semiconductor channel region and having a first top electrode surface at a first height from the first bottom gate electrode surface; and
   a second MOS transistor disposed over a second portion of the substrate, wherein the second MOS transistor comprises:
      a second semiconductor channel region; and
      a second gate electrode having a second bottom electrode surface proximate to a second gate dielectric disposed over the second semiconductor channel region and having at least a portion of a second top electrode surface at a second height from the second bottom electrode surface that is different than the first height, wherein the first and second gate electrodes further comprise at least a bulk material and a work function material, the work function material disposed between the bulk material and the gate dielectric and also along opposite sidewalls of the bulk material with both the bulk material and the work function material present at portions of the first and second top electrode surfaces, and wherein at least the bulk material of the first gate electrode is recessed relative to at least a portion of the second top electrode surface.

6. The device of claim 5, wherein the bulk material of the first gate electrode is recessed from a top surface of the bulk material in the second gate electrode more than from a top surface of the work function material in the second gate electrode.

7. The device of claim 5, wherein both the bulk material and the work function material of the first gate electrode are recessed relative to at least a portion of the second top electrode surface.

8. A microprocessor comprising:
   an SRAM cache memory further comprising at least a first finFET associated with a first gate length; and
   an analog circuit further comprising at least a second finFET associated with a second gate length, greater than the first gate length, wherein the first finFET has a gate electrode top surface portion recessed below a top surface portion of a first spacer dielectric adjacent to a source and a drain of the first finFET, and wherein the second finFET has a gate electrode z-height non-recessed from a top surface portion of a second spacer dielectric adjacent to a source and a drain of the second finFET, or recessed from top surface portion of the second spacer dielectric by an amount less than the recess of the first gate electrode top surface portion relative to the top surface portion of the first spacer dielectric.

9. The microprocessor of claim 8, wherein the second gate length is at least 50% larger than the first gate length, and wherein the gate electrode of the first finFET has top surface portion recessed from a top surface portion of the gate electrode of the second finFET.

10. A mobile computing platform comprising:
   the microprocessor of claim 8,
   a display screen; and
   a wireless transceiver.

11. An integrated circuit device, comprising:
   a first MOS transistor disposed over a first portion of a substrate, wherein the first MOS transistor comprises:
      a first semiconductor channel region; and
      a first gate electrode having a first bottom electrode surface proximate to a first gate dielectric disposed over the first semiconductor channel region and having a first top electrode surface at a first height from the first bottom gate electrode surface; and
   a second MOS transistor disposed over a second portion of the substrate, wherein the second MOS transistor comprises:
      a second semiconductor channel region; and
      a second gate electrode having a second bottom electrode surface proximate to a second gate dielectric disposed over the second semiconductor channel region and having at least a portion of a second top electrode surface at a second height from the second bottom electrode surface that is smaller than the first height, wherein the second gate dielectric has a top dielectric surface at a third height from the second bottom gate electrode surface that is larger than the second height.

12. The device of claim 11, wherein the first gate electrode defines a gate length of the first MOS transistor that is larger than that of the second MOS transistor.

13. The device of claim 11, wherein at least a portion of the second top electrode surface is recessed by at least 30% of the first height.

14. An integrated circuit device, comprising:
a first MOS transistor disposed over a first portion of a substance, wherein the first MOS transistor comprises:
   a first semiconductor channel region; and
   a first gate electrode having a first bottom electrode surface proximate to a first gate dielectric disposed over the first semiconductor channel region and having a first top electrode surface at a first height from the first bottom gate electrode surface;
a second MOS transistor disposed over a second portion of the substrate, wherein the second MOS transistor comprises:
   a second semiconductor channel region; and
   a second gate electrode having a second bottom electrode surface proximate to a second gate dielectric disposed over the second semiconductor channel region and having at least a portion of a second top electrode surface at a second height from the second bottom electrode surface that is different than the first height;
a first semiconductor source and drain on opposite sides of the first semiconductor channel region;
a first spacer dielectric disposed between the first gate electrode and the first semiconductor source and drain;
a second semiconductor source and drain on opposite sides of the second semiconductor channel region; and
a second spacer dielectric disposed between the second gate electrode and the second semiconductor source and drain, wherein the first top electrode surface is recessed below a top surface portion of the first spacer dielectric by an amount greater than is the second top electrode surface relative to the second spacer dielectric.

15. The device of claim 14, wherein the second height is larger than the first height, and wherein the second gate electrode defines a gate length of the second MOS transistor that is larger than that of the first MO transistor.

16. The device of claim 14, wherein at least a portion of the second top electrode surface is recessed by at eat east 30% of the first height.

* * * * *